United States Patent
Okada et al.

(10) Patent No.: US 9,640,700 B2
(45) Date of Patent: May 2, 2017

(54) OPTICAL SENSOR, AND ELECTRONIC APPARATUS

(71) Applicant: SHARP KABUSHIKI KAISHA, Osaka-shi, Osaka (JP)

(72) Inventors: Norikazu Okada, Osaka (JP); Kohei Yasukawa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 259 days.

(21) Appl. No.: 14/434,065

(22) PCT Filed: Sep. 25, 2013

(86) PCT No.: PCT/JP2013/075903
§ 371 (c)(1),
(2) Date: Apr. 7, 2015

(87) PCT Pub. No.: WO2014/057806
PCT Pub. Date: Apr. 17, 2014

(65) Prior Publication Data
US 2015/0263211 A1    Sep. 17, 2015

(30) Foreign Application Priority Data

Oct. 12, 2012 (JP) ................................. 2012-227412

(51) Int. Cl.
*H03F 3/08* (2006.01)
*H01L 31/101* (2006.01)
*H01L 31/02* (2006.01)

(52) U.S. Cl.
CPC ...... *H01L 31/101* (2013.01); *H01L 31/02019* (2013.01); *H03F 3/08* (2013.01); *H03F 3/082* (2013.01)

(58) Field of Classification Search
CPC .......... G05F 3/262; G09G 3/3241; H03F 3/08
See application file for complete search history.

(56) References Cited

U.S. PATENT DOCUMENTS

| 6,989,569 B1 | 1/2006 | Hiramoto et al. |
| 2008/0173796 A1* | 7/2008 | Lum .................. G01J 1/02 250/214 AL |
| 2013/0068926 A1 | 3/2013 | Okada |

FOREIGN PATENT DOCUMENTS

| JP | 2000-260991 A | 9/2000 |
| JP | 2001-53331 A | 2/2001 |

(Continued)

*Primary Examiner* — Thanh Luu
(74) *Attorney, Agent, or Firm* — Birch, Stewart, Kolasch & Birch, LLP

(57) ABSTRACT

A light receiving sensor (1) includes: a photodiode (PD) which generates a photocurrent (Ipd) upon receipt of light; a transistor (Tr11) through which the photocurrent (Ipd) flows; a transistor (Tr12) which forms, together with the transistor (Tr11), a first current mirror circuit (CM1); a transistor (Tr9) whose channel type is different from that of the transistor (Tr11), and a resistor (R10) which converts, to a voltage, a current flowing through the transistors (Tr11 and Tr12). The first current mirror circuit (CM1) amplifies the photocurrent (Ipd), the transistor (Tr11) has a source connected with a gate of a MOS transistor (Tr9), and the MOS transistor (Tr9) has a threshold voltage that is set to be equal to or above a threshold voltage of the transistor (Tr11). This decreases a capacity of the photodiode (PD) and therefore allows the light receiving sensor (1) to operate at a high speed while the photodiode (PD) is biased.

7 Claims, 10 Drawing Sheets

(56) References Cited

FOREIGN PATENT DOCUMENTS

JP   3174852 B2   6/2001
JP   2012-89738 A   5/2012

\* cited by examiner

F I G. 1
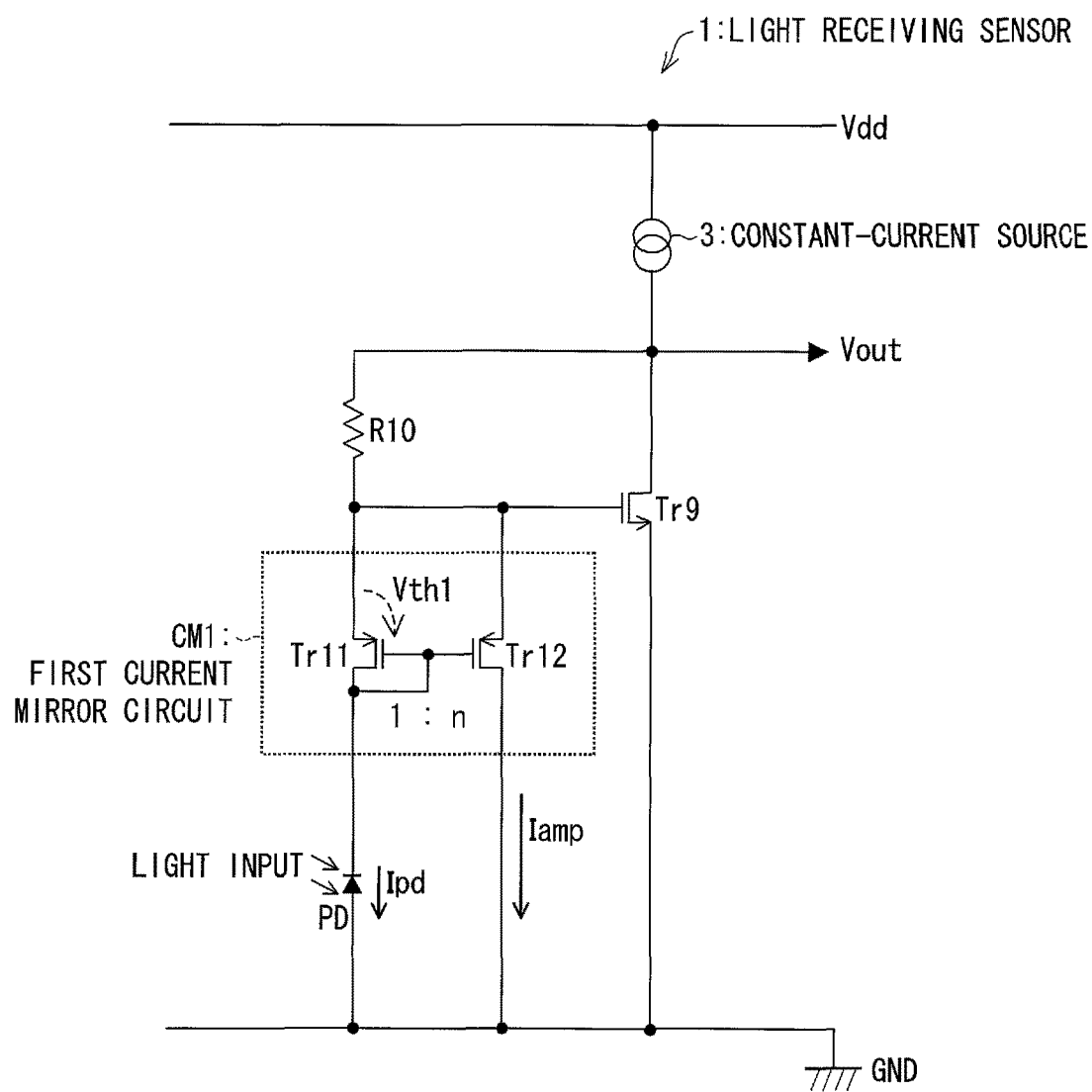

F I G. 4
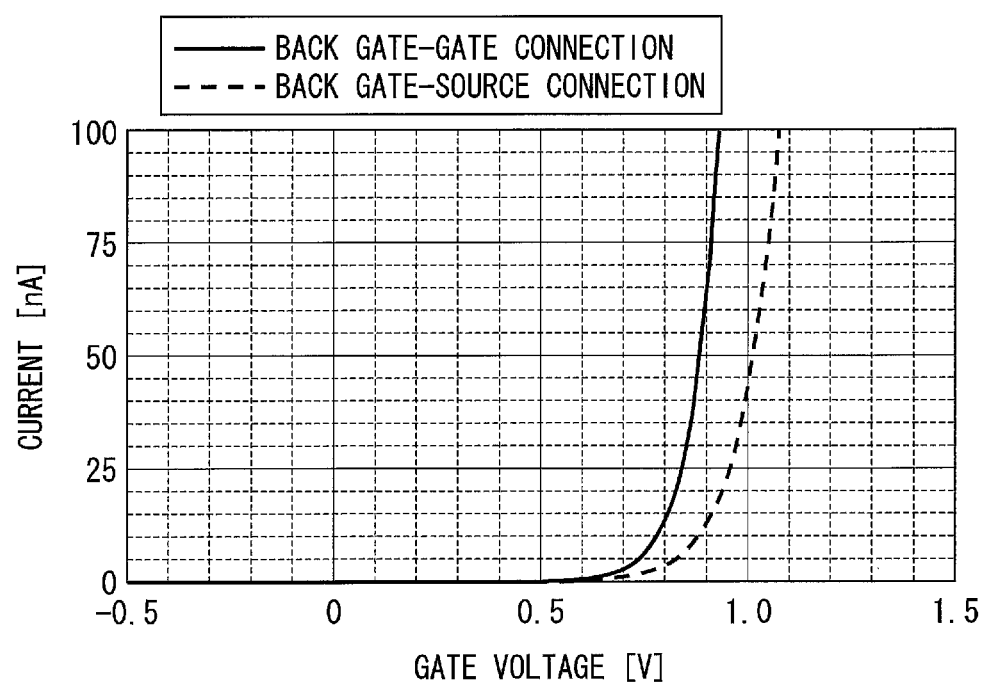

F I G. 7
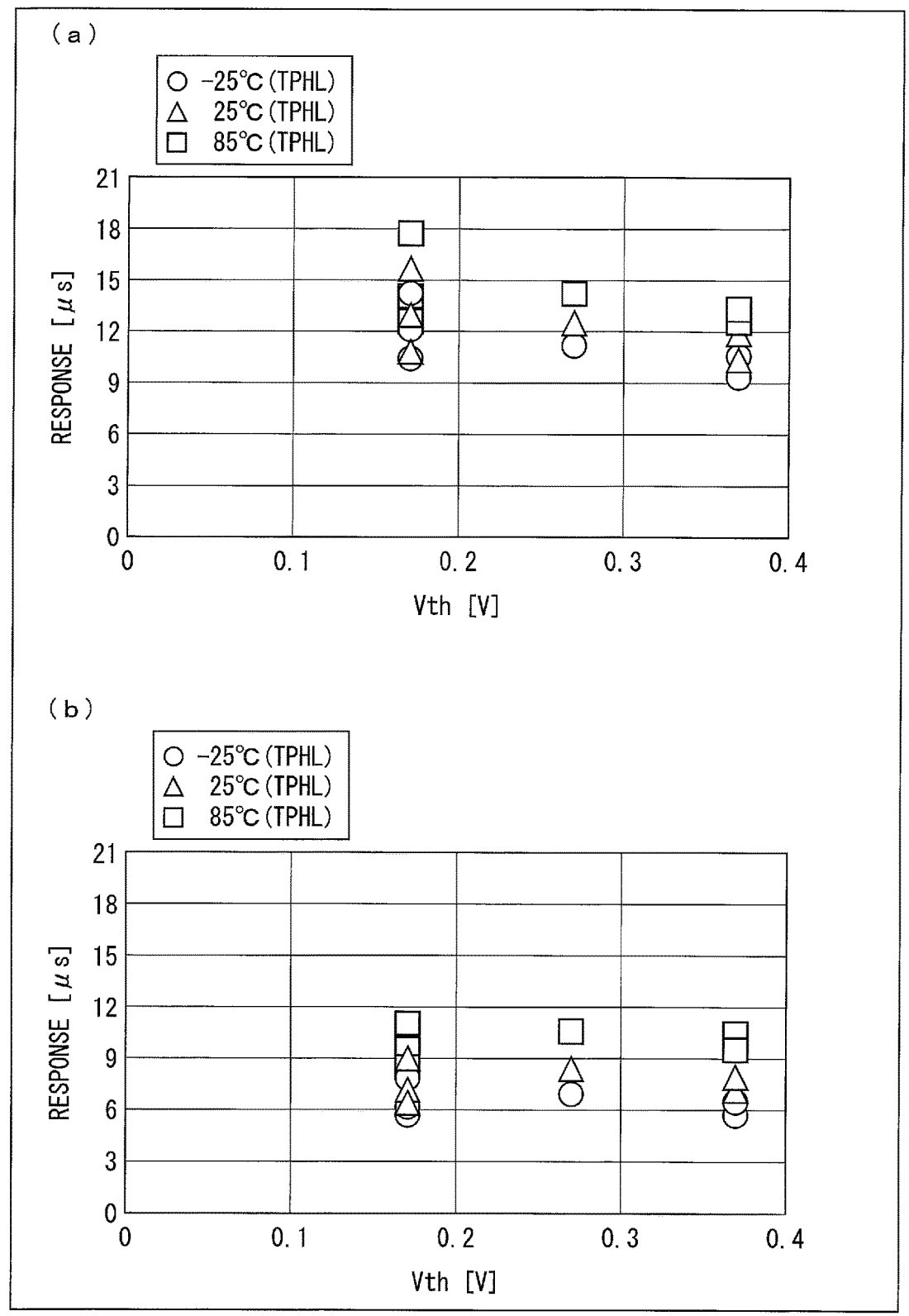

F I G. 9
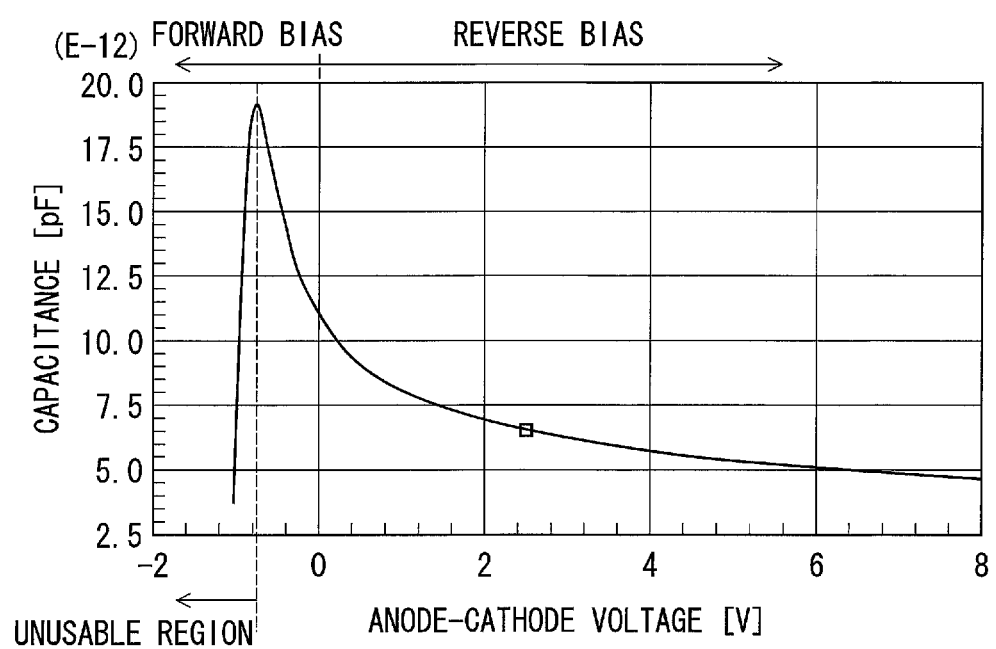

F I G. 10
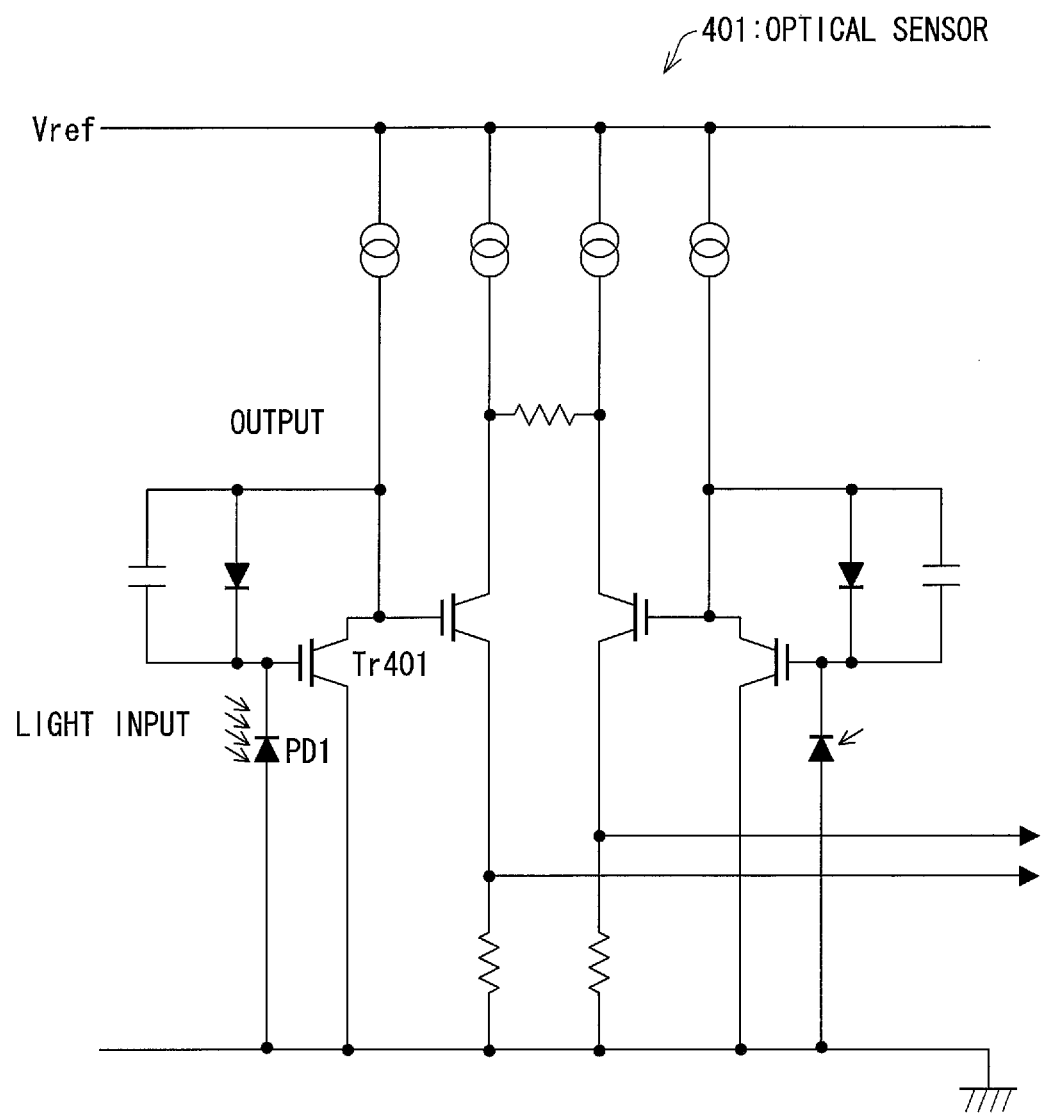

OPTICAL SENSOR, AND ELECTRONIC APPARATUS

TECHNICAL FIELD

The present invention relates to an optical sensor suitable for, for example, a photo interrupter which is used for a detection of an object and a detection of an operating speed of an object.

BACKGROUND ART

An electric appliance such as a digital camera and an ink jet printer includes an operation component which is driven by a motor. An optical sensor such as a photo interrupter is used to detect, for example, an operating speed of the operation component.

A certain optical sensor, among such optical sensors, has a light receiving unit including a phototransistor and obtains a detection signal by converting, to a voltage, a photocurrent flowing through a phototransistor by use of an external resistance. In this manner, a dependency of the detection signal on the photocurrent leads to a dependency of a sensor response on the photocurrent. Thus, an improvement in responsiveness of the sensor is limited. In summary, the optical sensor using a photo interrupter is not suitable for an apparatus, such as a digital camera, for which a high-speed operation is required. Under such circumstance, there is a demand for an optical sensor operable at a high speed without depending on a photocurrent.

For example, Patent Literature 1 discloses an optical sensor (a light-receiving device) configured such that an end of a photodiode and an end of a load are fixed to GND electric potential. Such light-receiving device allows a prevention of a fluctuation in a bias voltage of a photodiode.

Further, Patent Literature 2 discloses an optical sensor configured to bias a photodiode with a gate-source voltage of an nchMOS transistor. Even this type of optical sensor can prevent the fluctuation in the bias voltage of the photodiode.

Both of the optical sensors disclosed in Patent Literatures 1 and 2 can prevent an electric potential difference ΔV between a cathode and an anode of the photodiode by applying the bias voltage to the photodiode. Accordingly, it is possible to decrease an electric charge (ΔQ=C×ΔV) of a capacitance of a photodiode, which capacitance is generated when the photocurrent flowing through the photodiode is converted into a voltage by the resistor. As a result, the optical sensors can operate at a high speed.

This kind of technique can be also applied to the phototransistor so as to allow the high-speed operation of the optical sensor including the phototransistor.

CITATION LIST

Patent Literature

Patent Literature 1
 Japanese Published Unexamined Patent Application [Japanese Patent Application Publication No. 2001-53331 (Publication date: Feb. 23, 2001)]
Patent Literature 2
 Japanese Published Unexamined Patent Application [Japanese Patent Application Publication No. 2012-89738 (Publication date: May 10, 2012)]

Patent Literature 3
 Japanese Patent Publication [Japanese Patent No. 3174852 (Publication date: Jun. 11, 2001)]

SUMMARY OF INVENTION

Technical Problem

FIG. 9 is a graph showing a change in capacitance of a photodiode with respect to a voltage across an anode and a cathode of the photodiode. FIG. 9 indicates that applying a bias voltage to the photodiode as in Patent Literatures 1 and 2 reduces the electric potential difference ΔV, but leads to a fluctuation of a capacitance value by the bias voltage.

Patent Literature 1 discloses a configuration in which the cathode of the photodiode is connected with the GND. In such configuration, a forward bias is applied to the photodiode. In a range in which the forward bias is applied, capacitance value of the photodiode increases, and an operating speed of the photodiode decreases (see FIG. 9).

Note that as for a photodiode, a forward current produced by a pn junction diode predominantly flows through the photodiode in a region to which a forward bias of 0.7 V or above is applied. In that region, the photodiode cannot fulfill its original function.

An optical sensor 401 illustrated in FIG. 10 (the optical sensor disclosed in Patent Literature 2) is configured such that a photodiode PD1 is provided between a gate and a source of an NchMOS transistor Tr401, and that the anode of the photodiode PD1 is connected with the GND. Thus, the photodiode PD1 is reverse-biased. This causes a decrease in capacitance value of the photodiode PD1. However, in a case where a photoelectric conversion is made by using the reverse-biased photodiode PD1 with use of a threshold voltage of the NchMOS transistor Tr401, it is difficult to improve an SN ratio of a detection signal if the photocurrent is small. An impossibility to sufficiently secure the SN ratio of the detection signal causes a disadvantage in which an operation margin of the optical sensor 401 is decreased.

The present invention is made in view of the above problem, and an object of the present invention is to provide an optical sensor which can sufficiently secure the SN ratio of the detection signal even if a small amount of light is received and can also make a response at a high speed while a photodiode is biased.

Solution to Problem

In order to solve the above problem, an optical sensor of one aspect of the present invention, which optical sensor comprises: a photodiode which generates a photocurrent upon receipt of light; a first MOS transistor through which the photocurrent flows; a second MOS transistor which forms, together with the first MOS transistor, a current mirror circuit; a third MOS transistor whose channel type is different from that of the first MOS transistor; and a current-voltage conversion element which converts, to a voltage, a current flowing through the second MOS transistor, the current mirror circuit amplifying the photocurrent, the first MOS transistor having a source connected with a gate of the third MOS transistor, and the third MOS transistor having a threshold voltage that is set to be equal to or above a threshold voltage of the first MOS transistor.

Advantageous Effects of Invention

According to one aspect of the present invention, a decrease in a capacitance value of a photodiode allows the optical sensor to operate at a high speed while the photodiode is biased. Further, it is possible to secure a sufficient magnitude of the SN ratio of the detection signal with respect to a small photocurrent because a current larger than the photocurrent flowing through the resistor cause a sufficient magnitude of the current to be secured even if the photocurrent is small. This yields an effect of realizing a high-speed and high-accuracy optical sensor.

BRIEF DESCRIPTION OF DRAWINGS

FIG. 1 is a circuit diagram illustrating a configuration of a light receiving sensor of Embodiments 1 and 3 of the present invention.

Figure 3:
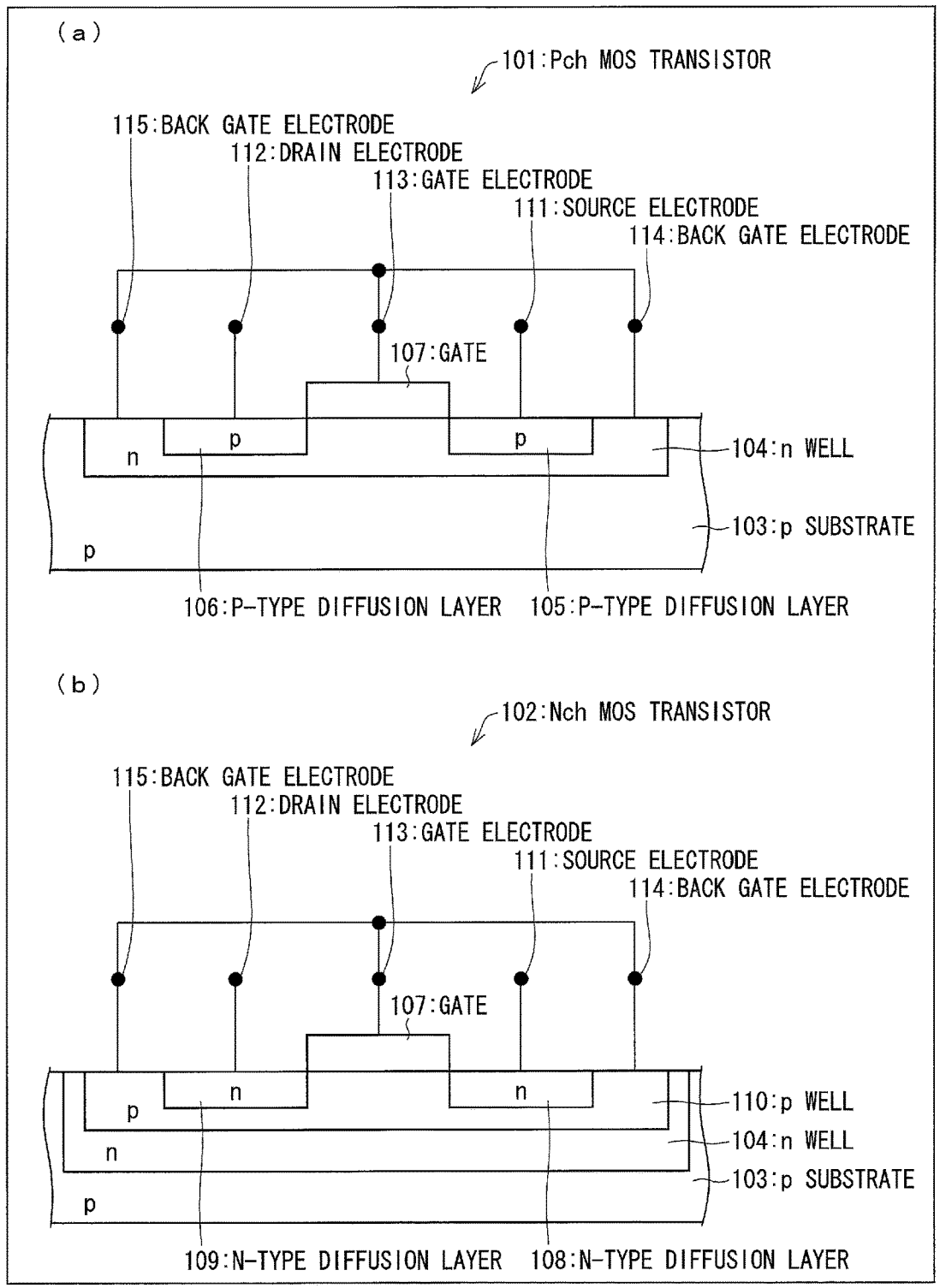

(a) of FIG. 3 is a sectional view illustrating a configuration of a PchMOS transistor whose gate electrode and back gate electrode are connected. (b) of FIG. 3 is a sectional view illustrating a configuration of an NchMOS transistor whose gate electrode and back gate electrode are connected.

FIG. 4 is a graph showing characteristics of currents relative to a gate voltage for a back gate-gate connection and a back gate-source connection of a MOS transistor which is connected with a photodiode in the light receiving sensor illustrated in FIG. 1.

Figure 5:
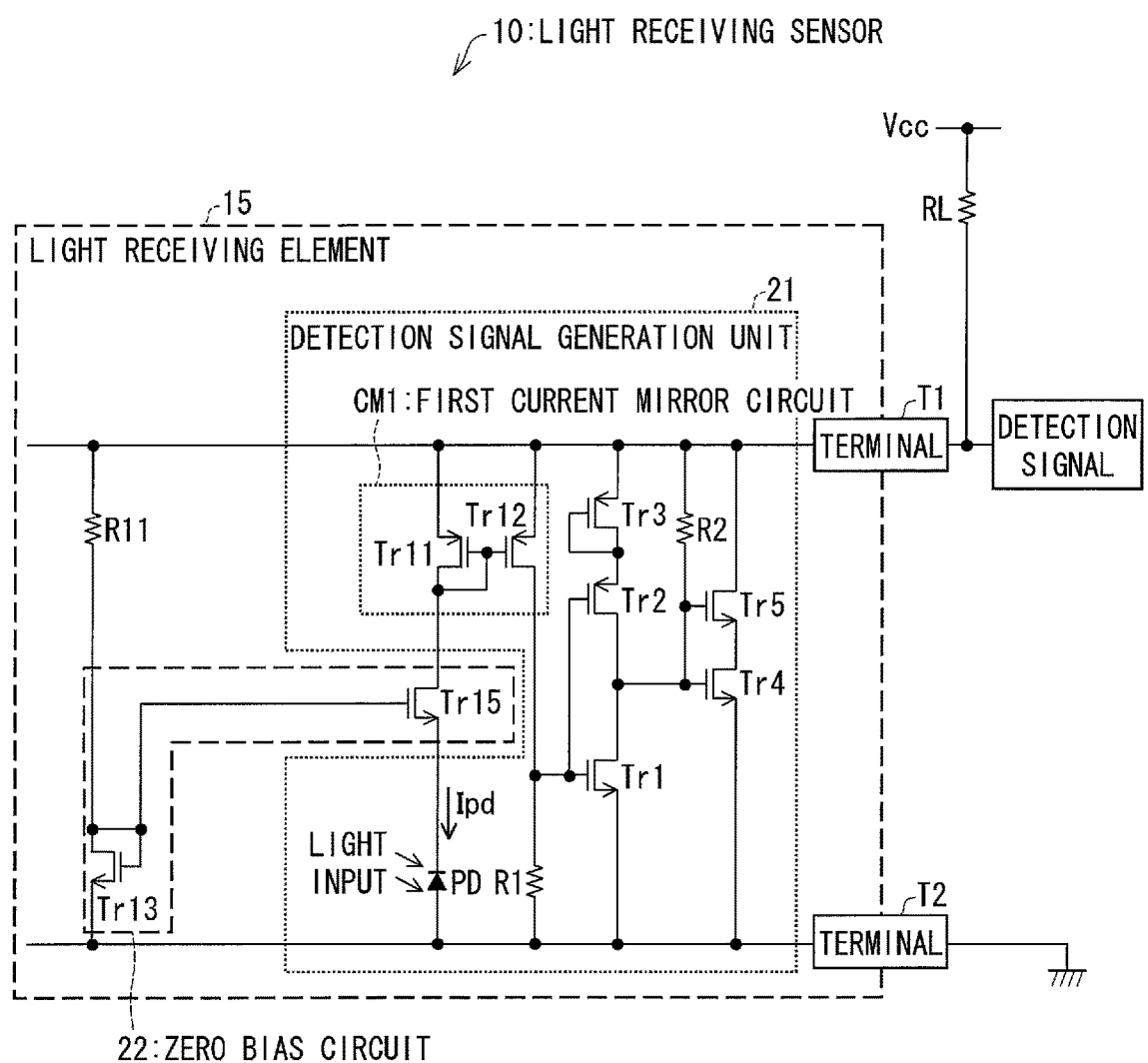

FIG. 5 is a circuit diagram illustrating a configuration of a light receiving sensor of Embodiment 4 of the present invention.

Figure 6:
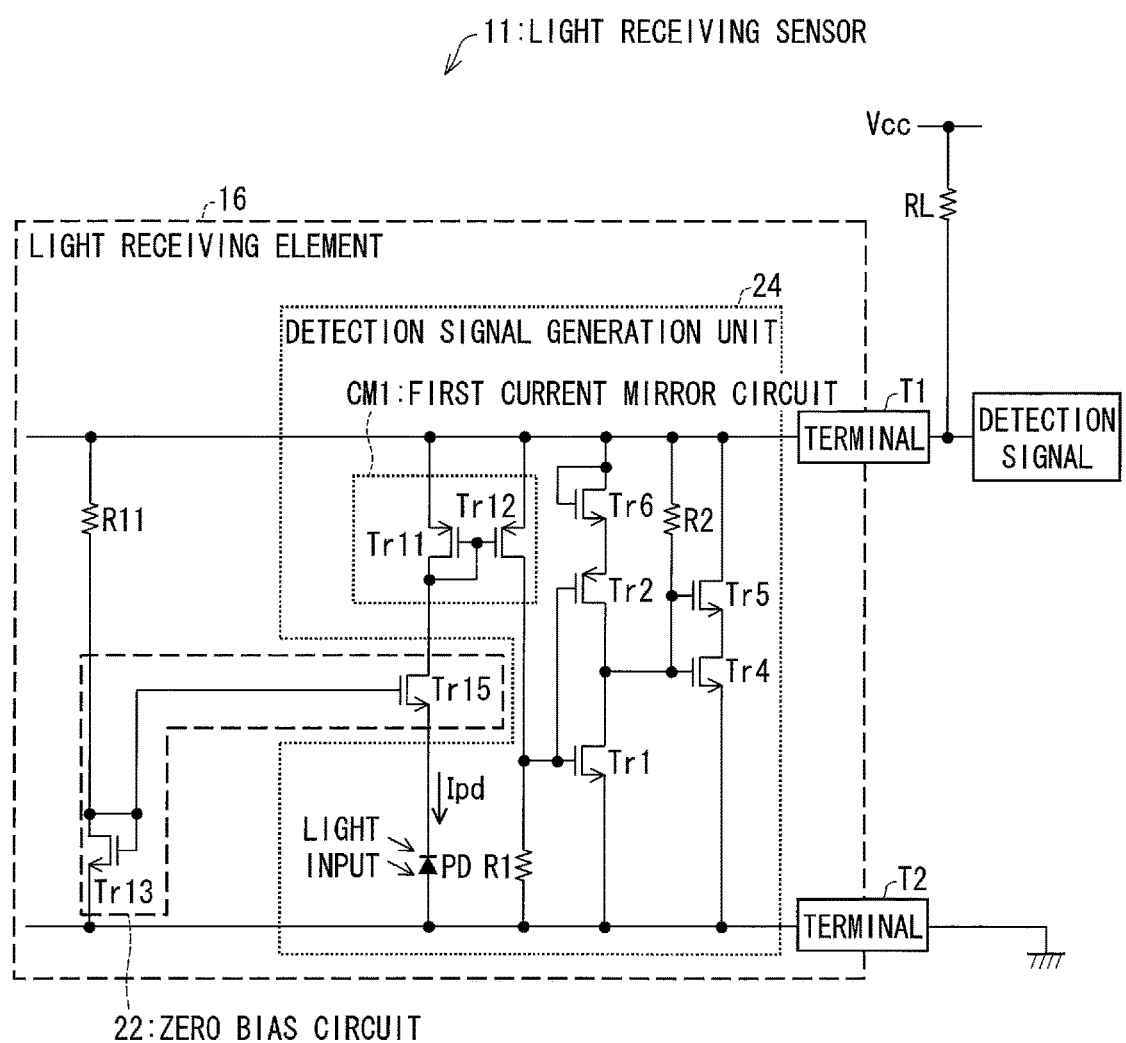

FIG. 6 is a circuit diagram illustrating a configuration of a light receiving sensor of Embodiment 5 of the present invention.

(a) of FIG. 7 illustrates a simulation result of a response property relative to an NchMOS transistor when a detection signal of the light receiving sensor illustrated in FIG. 5 is changed from a high level to a low level. (b) of FIG. 7 illustrates a simulation result of a response property relative to an NchMOS transistor when a detection signal of the light receiving sensor illustrated in FIG. 6 is changed from a high level to a low level.

Figure 8:
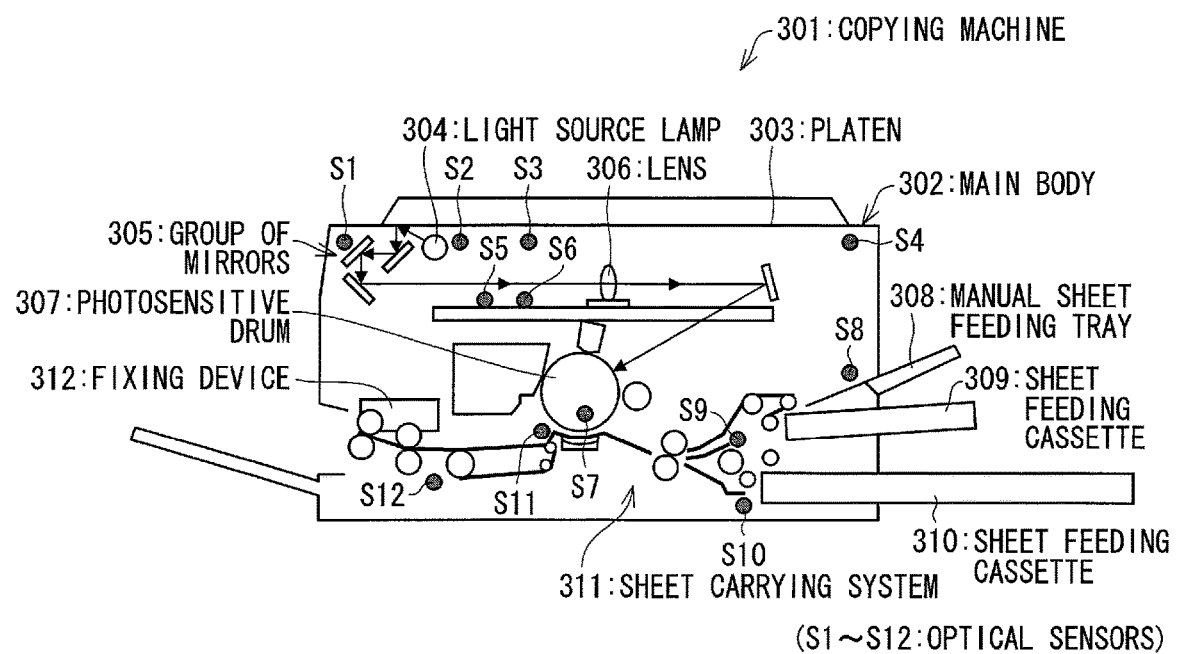

FIG. 8 is a front view illustrating an inner structure of a copying machine of Embodiment 6 of the present invention.

FIG. 9 is a graph showing a property of a capacitance relative to a voltage across an anode and a cathode of a photodiode.

FIG. 10 is a circuit diagram illustrating a configuration of a conventional optical sensor.

DESCRIPTION OF EMBODIMENTS

Embodiment 1

The following description discusses Embodiment 1 of the present invention with reference to FIG. 1.
[Configuration of Light Receiving Sensor]
FIG. 1 is a circuit diagram illustrating a configuration of a light receiving sensor 1 of the present embodiment.

As illustrated in FIG. 1, the light receiving sensor 1 (an optical sensor) includes a photodiode PD, a first current mirror circuit CM1, a transistor Tr9, a resistor R10 (a current-voltage conversion element), and a constant-current source 3.

The photodiode PD is a photoelectric conversion element which, upon receipt of incoming light, passes a photocurrent Ipd. An anode of the photodiode PD is connected with a ground line to which a GND electric potential is given.

Further, as described below, a cathode of the photodiode PD is connected with the first current mirror circuit CM1.

The first current mirror circuit CM1 includes a pair of PchMOS transistors: transistors Tr11 and Tr12 (P-type MOS transistors). A drain of the transistor Tr11 (a first MOS transistor) on an input side is connected with each a cathode of the photodiode PD and a gate of the transistor Tr11. Further, a source of the transistor Tr11 is connected with an output terminal via a resistor R10. A drain of the transistor Tr12 on an output side is connected with a ground line, and a source of the transistor Tr12 is connected with the source of the transistor Tr11. Still further, a gate of the transistor Tr12 is connected with the gate of the transistor Tr11.

The first current mirror circuit CM1 is configured such that a dimension ratio of the transistors Tr11 and Tr12 is 1:n (n>1). Thus, the first current mirror circuit CM1 serves as a current amplifier which amplifies the photocurrent Ipd by n times. Upper limit of the value of n is around several tens.

The transistor Tr9 (a third MOS transistor) is an NchMOS transistor. A source of the transistor Tr9 is connected with a ground line and a drain of the transistor Tr9 is connected with the output terminal. Further, a gate of the transistor Tr9 is connected with each source of the transistors Tr11 and Tr12. To the output terminal, an output voltage Vout as the detection signal is outputted.

A constant-current source 3 is connected between the output terminal and a power-supply line to which a constant voltage Vdd is applied and is provided to flow constant currents through a resistor R10 and a transistor Tr9.
[Operation of Light Receiving Sensor]
The light receiving sensor 1 as configured above operates as follows.

Upon receipt of light, the photodiode PD generates the photocurrent Ipd. Accordingly, the transistors Tr11 and Tr12 in the first current mirror circuit CM1 are turned on. Further, an on-operation of the transistor Tr9 is continued because the transistor Tr9 is biased by the constant-current source 3 regardless of presence or absence of a light input.

Still further, the first current mirror circuit CM1 amplifies the photocurrent Ipd by n times to flow, through the transistor Tr12, an amplified photocurrent Iamp which is n times larger than the photocurrent Ipd. This causes the first current mirror circuit CM1 to pass, through the resistor R10, a current that is (n+1) times larger than the photocurrent Ipd. This current is converted to a voltage by the resistor R10. This voltage is the output voltage Vout outputted as a high level detection signal from the output terminal, and the output voltage Vout is represented by the following expression:

$$Vout=(n+1) \times Ipd \times R10+Vth9,$$

where Ipd is a current value of the photocurrent Ipd, R10 is a resistance value of the resistor R10, and Vth9 is a threshold voltage of the transistor Tr9.

Further, a value of a bias voltage of the photodiode PD corresponds to a value obtained by subtracting a threshold voltage of the transistor Tr11 from a threshold voltage of the transistor Tr9. Thus, it is preferable that the threshold voltage of the transistor Tr9 is equal to or above the threshold voltage of the transistor Tr11. Accordingly, it is possible to reduce a capacitance of the photodiode PD.

On the other hand, the photodiode PD not receiving light does not generate the photocurrent Ipd. Thus, both of the transistors Tr11 and Tr12 in the first current mirror circuit CM1 are off. Further, a voltage from the power-supply line is applied to the gate of the transistor Tr9 via the resistor R10. Accordingly, an electric potential of the output terminal is decreased to the threshold voltage Vth9 of the transistor Tr9. Thus, a decrease in the electric potential of the output terminal causes a low level detection signal to appear at the output terminal.

[Effects Obtained by Light Receiving Sensor]

As described earlier, the light receiving sensor 1 of the present embodiment includes the first current mirror circuit CM1 and the transistor Tr9. The first current mirror circuit CM1 amplifies the photocurrent Ipd by n times. The transistor Tr9 has a drain and a source being connected with the output terminal and the ground line, respectively. Further, each source of the transistors Tr11 and Tr12 in the first current mirror circuit CM1 is connected with the gate of the transistor Tr9. Still further, the threshold voltage of the transistor Tr9 is set so as to be equal to or above the threshold voltage of the transistor Tr11.

This decreases a capacitance value of the photodiode PD causes an operating speed of the photodiode PD to be improved. Further, a current flowing through the resistor R10 is larger than the photocurrent Ipd so that the light receiving sensor 1 can largely reduce a dependency of the detection signal on the photocurrent Ipd. Accordingly, the light receiving sensor 1 can operate at a high speed. Therefore, the light receiving sensor 1 can be suitably used for an apparatus which has to detect, at a high speed, an object to be inspected.

Further, a current larger than the photocurrent Ipd flows through the resistor R10. Thus, it is possible to ensure that the current flowing through the resistor R10 has a sufficiently large current even if a magnitude of the photocurrent Ipd is very small. Accordingly, it is possible to secure a sufficiently large SN ratio of the detection signal (the output voltage Vout) with respect to the very small photocurrent Ipd.

Embodiment 2

Figure 2:
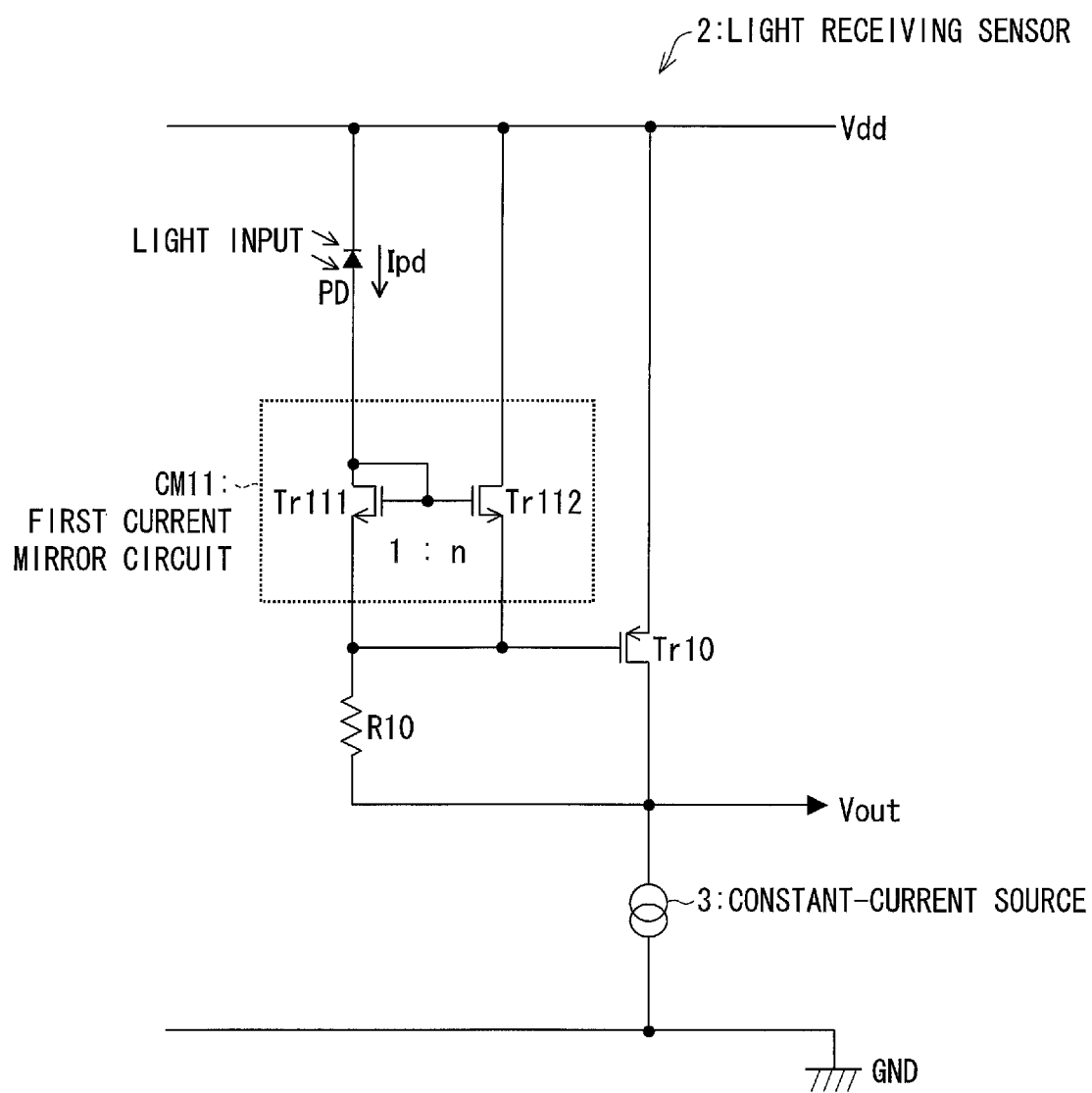
FIG. 2 is a circuit diagram illustrating a configuration of a light receiving sensor of Embodiments 2 and 3 of the present invention.

The following description discusses Embodiment 2 of the present invention with reference to FIG. 2.

Note that in Embodiment 2, identical reference signs are given to components having the same functions as components in Embodiment 1, and descriptions of the components are omitted.

[Configuration of Light Receiving Sensor]

FIG. 2 is a circuit diagram illustrating a configuration of a light receiving sensor 2 of the present embodiment.

As illustrated in FIG. 2, the light receiving sensor 2 (an optical sensor) includes a photodiode PD, a first current mirror circuit CM11, a transistor Tr10, a resistor R10, and a constant-current source 3.

The light receiving sensor 2 is configured such that a cathode of the photodiode PD is connected with the power-supply line.

The first current mirror circuit CM11 includes a pair of NchMOS transistors: the transistors Tr111 and Tr112 (N-type MOS transistors). A drain of the transistor Tr111 on an input side (a first MOS transistor) is connected with each an anode of the photodiode PD and a gate of the transistor Tr111. Further, a source of the transistor Tr111 is connected with an output terminal via the resistor R10. A drain of the transistor Tr112 on an output side is connected with the power-supply line and a source of the transistor Tr112 is connected with the source of the transistor Tr111. Still further, a gate of the transistor Tr112 is connected with the gate of the transistor Tr111.

The first current mirror circuit CM11 is configured such that a dimension ratio of the transistor Tr111 and the transistor Tr112 is 1:n(n>1). Thus, the first current mirror circuit CM11 serves as a current amplifier which amplifies the photocurrent Ipd by n times.

The transistor Tr10 (a third MOS transistor) is a PchMOS transistor whose channel type is different from channel types of the transistors Tr111 and Tr112. A source of the transistor Tr10 is connected with the power-supply line and a drain of the transistor Tr10 is connected with the output terminal. Further, a gate of the transistor Tr10 is connected with each source of the transistors Tr111 and Tr112. To the output terminal, the output voltage Vout as the detection signal is outputted.

The constant-current source 3 is connected between the power-supply line and the output terminal and is provided to flow constant currents through the resistor R10 and the transistor Tr10.

[Operation of Light Receiving Sensor]

The light receiving sensor 2 as configured above operates as follows.

Upon receipt of light, the photodiode PD generates the photocurrent Ipd. Accordingly, the transistors Tr111 and Tr112 in the first current mirror circuit CM11 are turned on.

Further, the first current mirror circuit CM11 amplifies the photocurrent Ipd by n times. This causes the first current mirror circuit CM11 to pass, through the resistor R10, a current that is (n+1) times larger than the photocurrent Ipd. The current is converted to a voltage by the resistor R10. The voltage obtained by the conversion is added to the threshold voltage of the transistor Tr10, and a resultant voltage is then subtracted from the constant voltage Vdd so as to obtain an output voltage Vout as represented by the above expression. The output voltage Vout is outputted as a low level detection signal from the output terminal.

Still further, a value obtained by subtracting the threshold voltage of the transistor Tr111 from the threshold voltage of the transistor Tr10 is 0 V or above. Accordingly, a bias voltage of a reverse bias is applied to the photodiode PD.

On the other hand, the photodiode PD not receiving inputted light does not generate the photocurrent Ipd. Thus, the first current mirror circuit CM11 is configured such that both transistors Tr111 and Tr112 are off. A value of an electric potential of the output terminal corresponds to a value obtained by subtracting the threshold voltage of the transistor Tr10 from the constant voltage Vdd so that a high level detection signal appears at the output terminal.

[Effects Obtained by Light Receiving Sensor]

As described earlier, the light receiving sensor 2 of the present embodiment includes the first current mirror circuit CM11 and the transistor Tr10. The first current mirror circuit CM11 amplifies the photocurrent Ipd by n times. The transistor Tr10 has a drain and a source being connected with the output terminal and the ground line, respectively. Further, each source of the transistors Tr111 and Tr112 in the first current mirror circuit CM11 is connected with the gate of the transistor Tr10. Still further, the threshold voltage of the transistor Tr10 is set so as to be equal to or above the threshold voltage of the transistor Tr111.

Accordingly, as similar to the light receiving sensor 1, the light receiving sensor 2 can largely reduce a dependency of the detection signal on the photocurrent Ipd because the current flowing through the resistor R10 is larger than the photocurrent Ipd. Accordingly, the light receiving sensor 2 can operate at a high speed. Therefore, the light receiving sensor 2 can be suitably used for an apparatus which has to detect, at a high speed, an object to be inspected.

Further, as in the light receiving sensor 1, a current larger than the photocurrent Ipd flows through the resistor R10.

Thus, it is possible to ensure that the current flowing through the resistor R10 has a sufficiently large current even if the photocurrent Ipd is very small. Accordingly, it is possible to secure a sufficiently large SN ratio of the detection signal (the output voltage Vout) with respect to the very small photocurrent Ipd.

Embodiment 3

The following description discusses Embodiment 3 of the present invention with reference to FIGS. 1 to 4.

Note that in Embodiment 3, identical reference signs are given to components having the same function of components in Embodiments 1 and 2, and descriptions of the components are omitted.

[Configuration of Light Receiving Sensor]

(a) of FIG. 3 is a sectional view of a structure of a PchMOS transistor in which a gate electrode and a back gate electrode are connected with each other. (b) of FIG. 3 is a sectional view of an NchMOS transistor in which a gate electrode and a back gate electrode are connected with each other.

<Light Receiving Sensor 1>

The light receiving sensor 1 is configured such that a gate and a back gate of the transistor Tr11 are connected with each other.

As illustrated in (a) of FIG. 3, normally in a case where a PchMOS transistor 101 (the P-type MOS transistor) is to be provided on a p substrate 103, the PchMOS transistor 101 is provided in an n well 104 which is provided in the p substrate 103. In the n well 104, a p-type diffusion layer 105 forming a source and a p-type diffusion layer 106 forming a drain are provided. Further, in the n well 104, a channel is provided between the p-type diffusion layers 105 and 106. On the n well 104, a gate 107 is provided on a region thereof corresponding to the channel.

The source electrode 111 and the drain electrode 112 are connected with the p-type diffusion layer 105 and the p-type diffusion layer 106, respectively. Further, the gate electrode 113 is connected with the gate 107.

A MOS transistor is usually configured such that a substrate serves as a gate. Thus, the gate is treated as a back gate. The PchMOS transistor 101 is configured such that the n well 104 serves as a substrate. Thus, the n well 104 is treated as a back gate. Accordingly, back gate electrodes 114 and 115 are each connected with the n well 104. Further, a gate electrode 113 is connected with each of the back gate electrodes 114 and 115.

A connection structure of the electrodes in the PchMOS transistor 101 as described above is applied to the transistor Tr11.

<Light Receiving Sensor 2>

The light receiving sensor 2 is configured such that a gate and a back gate of the transistor Tr111 are connected with each other.

As illustrated in (b) of FIG. 3, an NchMOS transistor 102 (an N-type MOS transistor) is configured such that the n well 104 is provided on the p substrate 103, and a p well 110 is formed in the n well 104. On the p well 110, an n-type diffusion layer 108 forming a source and an n-type diffusion layer 109 forming a drain are provided. Further, in the p substrate 103, a channel is provided between the n-type diffusion layers 108 and 109. On the p substrate, a gate 107 is provided on a region thereof corresponding to the channel.

The source electrode 111 and the drain electrode 112 are connected with the n-type diffusion layer 108 and the n-type diffusion layer 109, respectively. Further, the gate electrode 113 is connected with the gate 107.

The NchMOS transistor 102 is configured such that the p-well 110 serves as a back gate. Thus, back gate electrodes 114 and 115 are each connected with the p well 110. Further, the gate electrode 113 is connected with each of the back gate electrodes 114 and 115.

A connection structure of the electrodes in the NchMOS transistor 102 as described above is applied to the transistor Tr111.

[Effects Obtained by Light Receiving Sensor]

FIG. 4 is a graph showing characteristics of currents relative to a gate voltage for a back gate-gate connection (a dynamic threshold MOS transistor) and relative to a gate voltage for a back gate-source connection in the transistor Tr11. Patent Literature 3 discloses the dynamic threshold MOS transistor.

A MOS transistor usually generates a leakage current between a drain and a source even at a gate-source voltage of 0 V when a diffusive concentration is changed to decrease a threshold voltage. At the occurrence of this kind of phenomenon, the photocurrent Ipd does not decrease even when the light receiving sensors 1 and 2 do not receive light. This may cause the light receiving sensors 1 and 2 to make a false detection.

In view of this, the light receiving sensor 1 is configured such that a back gate and a gate of the transistor Tr11, which is the PchMOS transistor, are connected. Further, the light receiving sensor 2 is configured such that a back gate and a gate of the transistor Tr111, which is the NchMOS transistor, are connected. Accordingly, it is possible to decrease threshold voltages of the transistors Tr11 and Tr111 without changing a diffusive concentration. This leads to a decrease of a leakage current, and thus, a reverse bias voltage of the photodiode PD can be further increased. Consequently, it is possible to improve response speeds of the light receiving sensors 1 and 2. In summary, the back gate and gate of each of the transistors Tr11 and Tr111 are beneficially connected.

FIG. 4 shows the result of simulations of current values of (n+1)×Ipd with respect to a gate-source voltage of the transistor Tr11 in the transistor Tr11 in which the back gate is connected with the gate and in the transistor Tr11 in which the back gate is connected with the source.

As is evident from FIG. 4, the transistor Tr11 in which the back gate is connected with the gate decrease the threshold voltage by around 60 mV with a current value of 50 nA as compared with the transistor Tr11 in which the back gate is connected with the source.

Embodiment 4

The following description discusses Embodiment 4 of the present invention with reference to FIG. 5.

Note that in Embodiment 4, identical reference signs are given to components having the same functions as components in Embodiments 1 through 3, and descriptions of the components are omitted.

[Configuration of Light Receiving Sensor]

FIG. 5 is a circuit diagram illustrating a configuration of a light receiving sensor 10 of the present embodiment.

As illustrated in FIG. 5, the light receiving sensor 10 (an optical sensor) includes a light receiving element 15 and an external resistor RL.

The light receiving element 15 includes two terminals T1 and T2, a resistor R11, a detection signal generation unit 21, and a zero bias circuit 22. The light receiving element 15 is a two-terminal optical detection circuit which, upon receipt of light, fluctuates a circuit current and, in turn, fluctuates an electric potential of the terminal T1 relative to a fixed potential of the terminal T2 so as to output a detection signal.

(1) Configuration of Terminal

The terminal T1 (a first terminal) serves as both an output terminal from which a detection signal is outputted and a supply terminal to which a power source voltage Vcc is applied. The terminal T1 is connected with a power-supply line via the external resistor RL. The terminal T2 (a second terminal) is a grounding terminal which is connected with a ground line and to which a grounding potential (a fixed potential) is given.

Note that the terminal T1 can be a terminal to which a fixed potential is given and the terminal T2 can be a terminal with fluctuating electric potentials.

The light receiving element 15 is a circuit which, upon receipt of light directly from a light emitting element (not shown) or upon receipt of light reflected by an object, converts the light to an electric signal (a detection signal) and then outputs the electric signal.

(2) Configuration of Detection Signal Generation Unit

The detection signal generation unit 21 includes a photodiode PD, resistors R1 and R2, transistors Tr1 to Tr5 (MOS transistors), and a first current mirror circuit CM1.

The photodiode PD has (i) an anode connected with the terminal T2 and (ii) a cathode connected with a source of the transistor Tr15 in the zero bias circuit 22.

Note that the detection signal generation unit 21 includes the photodiode PD as a photoelectric conversion element, but may include a phototransistor instead of the photodiode PD.

In the first current mirror circuit CM1, a drain of the transistor Tr11 on an input side is connected with a drain of the transistor Tr15 in a zero bias circuit 22 described later and with a gate of the transistor Tr11. Further, a source of the transistor Tr11 is connected with the terminal T1. A drain of the transistor Tr12 on an output side is connected with one end of the resistor R1 and with a gate of the transistor Tr1. A source of the transistor Tr12 is connected with the terminal T1.

Another end of the resistor R1 and a source of the transistor Tr1 are connected with the terminal T2. A drain of the transistor Tr1 is connected with a drain of the transistor Tr2 and with a gate of the transistor Tr4. A source of the transistor Tr2 is connected with a drain of the transistor Tr3, and a gate of the transistor Tr2 is connected with the gate of the transistor Tr1. The transistors Tr1 and Tr2 form an inverter by being connected in a manner as described above.

Further, the transistor Tr2 (an inverter MOS transistor) has a channel type which is the same as that of the transistor Tr1. Like the transistor Tr11, the transistor Tr2 is configured such that a back gate and a gate are connected with each other.

A source of the transistor Tr3 is connected with the terminal T1, and a gate of the transistor Tr3 is connected with the drain of the transistor Tr3. Accordingly, the transistor Tr3 functions as a diode.

A source of the transistor Tr4 is connected with the terminal T2, and a drain of the transistor Tr4 is connected with a source of the transistor Tr5. A drain of the transistor Tr5 is connected with the terminal T1 and a gate of the transistor Tr5 is connected with a gate of the transistor Tr4 and with one end of the resistor R2. Another end of the resistor R2 is connected with the terminal T1.

(3) Configuration of Zero Bias Circuit

The zero bias circuit 22 includes the transistors Tr13 and Tr15. As described earlier, the transistor Tr15 is connected with the photodiode PD and with the transistor Tr11 in the first current mirror circuit CM1. Further, a drain of the transistor Tr13 is connected with the terminal T1 via a resistor R11. Still further, a gate of the transistor Tr15 is connected with a gate of the transistor Tr13. The transistors Tr13 and Tr15 form a current mirror circuit with their gates connected with each other. Further, the transistors Tr13 and Tr15 form a grounded gate circuit.

[Operation of Light Receiving Sensor]

(1) Basic Operation

The photodiode PD, upon receipt of light, flows the photocurrent Ipd. The photocurrent Ipd is amplified by the first current mirror circuit CM1, flows through the resistor R1, and is then converted to a voltage by the resistor R1.

Accordingly, potentials of gates of the transistors Tr1 and Tr2 fluctuate. Then, a resistance value of the resistor R1 is so set that the gate potential exceeds a threshold voltage of the inverter when a value of the photocurrent Ipd is equal to or above a given value.

In a case where a current flowing through the resistor R1 upon receipt of light is converted into a voltage, the light which exceeds a threshold voltage of the inverter formed by the transistors Tr1 and Tr2 causes the transistor Tr2 to be turned off and causes the transistor Tr1 to be turned on. Accordingly, the transistor Tr4 is turned off to stop a flow of current (a terminal current) of the transistor Tr4. This increases a voltage (an electric potential difference) between the terminals T1 and T2 (two terminals).

On the other hand, when a decrease in a quantity of incoming light leads to a decrease of the photocurrent Ipd, a current amplified with the first current mirror circuit CM1 is decreased. This decreases a voltage across the terminals of the resistor R1. In a case where gate-source voltages of the transistors Tr1 and Tr2 are decreased to a threshold voltage of the inverter, the transistor Tr2 is turned on while the transistor Tr1 is on. Accordingly, the transistor Tr4 is turned on to decrease a voltage between the two terminals.

In this manner, a voltage between the two terminals is increased or decreased depending on whether the transistor Tr4 is off or on. Thus, a detection signal which appears between the two terminals, when incoming light is present is a high level voltage, and a detection signal which appears when incoming light is not present is a low level voltage. Specifically, when incoming light is present, a very small voltage drop is caused between two terminals by the photocurrent Ipd and a drive current of the transistor Tr1. On the other hand, when incoming light is not present, an output current of the light receiving element 15 is determined by a drive current of the transistor Tr4. Due to a voltage drop caused by the output current, an output voltage of the light receiving element 15 goes a low level. Detection performance improves with increase in difference between a high level output voltage and a low level output voltage of the light receiving element 15. Thus, an increase in drive current of the transistor Tr4 reduces an influence of the photocurrent Ipd.

Further, when the transistor Tr4 is on/off, the transistor Tr1 necessarily performs an on-operation, or both of the transistors Tr1 and Tr2 necessarily performs an on-operation. Accordingly, the transistor Tr4 can operate at a higher speed. Thus, a response speed of the light receiving sensor 10 can be improved.

Incidentally, the light receiving element 15 is configured such that a source voltage of the transistor Tr2 has to be decreased because the transistor Tr2 has to be switched depending on a voltage across the terminals of the resistor R1. In other words, it is necessary to prevent switching of the transistor Tr2 by depending on a source-drain voltage of the first current mirror circuit CM1. Thus, the transistor Tr3 which serves as a diode is arranged in series with the transistor Tr2.

Further, with this arrangement, operating points of the inverter at the change in output voltage of the light receiving element 15 from a high level to a low level and from at the change in output voltage from a low level to a high level can vary according to a drop and rise of a voltage between the two terminals. Thus, it is possible to obtain a hysteresis property.

(2) Prevention of Decrease in Response Speed

As described earlier, the transistors Tr1 and Tr2 form the inverter. This allows the transistor Tr4 to be switched at a high speed. However, in a case where an electric potential difference between two terminals is small, an electric potential difference between a gate and a drain of the transistor Tr2 gradually becomes small after a start of switching of the transistor Tr4. This reduces the current. Accordingly, a response speed of the light receiving element 15 gradually decreases.

Then, in order to avoid such inconvenience, the resistor R2 is provided in the light receiving element 15. Accordingly, a decrease in a voltage between two terminals is assisted with the resistor R2 so that a decrease in response speed can be prevented.

Meanwhile, if each transistor in the detection signal generation unit 21 in the light receiving element 15 is a MOS transistor, an adjustment of a dose amount can change an operation threshold level of the transistor. For example, an operation threshold level of a current generation transistor (the transistor Tr4 in the light receiving element 15) is set to 0.7 V or below so as to cause an electric potential difference between two terminals. This is because normally, a detection signal reception device in the light receiving sensor 10 sets a threshold level to be a diode voltage, in other words, to be 0.7 V or above.

Accordingly, an electric potential difference between two terminals can be made larger so as to widen an operation range of the light receiving element 15.

(3) Reduction in Leakage Current

If the light receiving element 15 uses a transistor with a low threshold level, it is concerned that a leakage current is caused when the transistor Tr4 is off under a high temperature. Causing such leakage current leads to an inconvenience in which an electric potential difference between two terminals is decreased even though, in nature, an electric potential difference between two terminals has to be increased.

Then, in order to avoid such inconvenience, the transistor Tr5 to be cascade-connected with the transistor Tr4 is provided. With this arrangement, a decrease in a drain voltage of the transistor Tr4 allows a decrease in the leakage current when the transistor Tr4 is off by $\frac{1}{10}$ or more. Thus, it is possible to largely reduce the leakage current when the transistor Tr4 is off. Especially, the transistor Tr4 has to be formed in a large size so that the transistor Tr4 which makes a switching operation flows a large magnitude of current, and thus, a leakage current easily becomes large accordingly. Therefore, it is possible to prevent a decrease in an electric potential difference between two terminals at the rise of an electric potential difference between two terminals.

Meanwhile, the transistor Tr1 may operate falsely if a fluctuation in a temperature property of a threshold level is large. This is because the threshold level of the MOS transistor is decreased under a high temperature. On the other hand, if, for example, a diffused resistor is used for a current-voltage conversion, sensitivity comes to have a large temperature property, because a resistance value rises under a high temperature.

In view of this, the light receiving element 15 is configured such that the resistor R1 (the bias resistor) is composed of a resistor (e.g., polysilicon resistor) having a negative temperature property so that such inconvenience can be prevented. Accordingly, a temperature property of the transistor Tr1 which is a MOS transistor and a temperature property of the resistor R1 can be cancelled out. As a result, it is possible to prevent a fluctuation in a temperature property of the light receiving element 15.

(4) Operation of Zero Bias Circuit

The zero bias circuit 22 is configured such that a potential of a source of the transistor Tr13 is a GND potential (a grounding potential) and each gate of the transistors Tr13 and Tr15 is a gate potential. Accordingly, a source of the transistor Tr15 is also a GND.

Therefore, an electric potential difference between an anode and a cathode of the photodiode PD is zero. Further, the transistor Tr15 is configured such that a source signal itself is a drain signal. As a result, there is no problem in a transmission of a signal.

[Effect Obtained by Light Receiving Section]

(1) Digitization of Detection Signal

It is necessary that a value of a current flowing between the terminals T1 and T2 of the light receiving sensor 10 is larger than a value of the photocurrent Ipd so as to depend on a current controlled by the transistor Tr4. For example, when the photocurrent Ipd takes a value up to several μA, the current controlled by the transistor Tr4 takes a value up to several mA.

Accordingly, the photocurrent Ipd is only used for a switching control of the transistor Tr4, so that the detection signal of the light receiving sensor 10 does not depend on the photocurrent Ipd. Thus, the detection signal to be outputted can be binary signals with a high level and a low level. In this manner, a use of the light receiving sensor 10 allows generating detection signal in digital form rather than in analog form. Thus, it is possible to cause the light receiving sensor 10 to be operated at a high speed.

Further, as described earlier, the digitization of the detection signal allows the light receiving sensor 10 to have a hysteresis property. This eliminates the need to provide a hysteresis circuit for converting an analog detection signal to a digital detection signal, like a conventional analog output sensor. Thus, a use of the light receiving sensor 10 is beneficial also in terms of a simplification of a circuit configuration.

(2) Improvement in Response Property

The light receiving sensor 10 is configured such that a source of the transistor Tr11 in the light receiving sensor 1 of Embodiment 1 is connected with a gate of the transistor Tr4 (the NchMOS transistor) via the resistor R2.

A current having the same magnitude as that of the current ((n+1)×Ipd) flowing through the transistors Tr11 and Tr12 flows through a channel under the gate of the transistor Tr4. The current is converted to a voltage by a channel resistor of the transistor Tr4. Accordingly, when light is not received, a voltage between the terminal T1 and the terminal T2 is decreased to a threshold voltage of the transistor Tr4.

Meanwhile, unlike the light receiving sensor 1, the light receiving sensor 10 does not include a constant-current source 3, so that a zero bias circuit 22 biases the photodiode PD. This is because the light receiving sensor 10, as in the light receiving sensor 1, is configured such that the photodiode PD is biased until the transistor Tr1 is turned on, but the photodiode PD is not biased when the transistor Tr4 is turned off.

Alternatively, the circuit of the light receiving sensor 10 may be arranged such all the MOS transistors in the light receiving sensor 10 is replaced with MOS transistors whose channel type is opposite to that of the MOS transistors in the light receiving sensor 10 so that the light receiving sensor 2 of Embodiment 2 is applied to the light receiving sensor 10.

In the light receiving sensor 10 having such an arrangement, a speed of change of the detection signal from a high level to a low level is determined according to an operating speed of the transistor Tr2. In view of this, by connecting a back gate and a gate of the transistor Tr2, a threshold voltage can be decreased as in the transistor Tr11 in Embodiment 3. Accordingly, the transistor Tr2 can be driven with a low voltage. Thus, an increase in operating speed of the transistor Tr4 allows the light receiving sensor 10 to be operated at a high speed. This is beneficial in improving a response property of the light receiving sensor.

Further, the light receiving sensor 10 is configured such that, upon receipt of light, the photodiode PD operates as described earlier, so that a value of an electric potential of the terminal T1 is almost the same as a value of the power source voltage Vcc. However, a small voltage drop is caused by the photocurrent Ipd. Receipt of light having an amount equal to or more than a predetermined amount causes a rise of a voltage of the resistor R1. This limits an operation current of the transistor Tr12. Thus, a voltage drop is limited.

On the other hand, when an amount of light received by the photodiode PD is decreased, the light receiving sensor 10 operates as described earlier, so that a voltage between the terminals T1 and T2 (a voltage between terminals) is decreased to a voltage determined by the threshold voltage of the transistor Tr4. Thus, a value of a voltage between the terminals corresponds to a value obtained by subtracting the threshold voltage from the power source voltage Vcc.

In this manner, if a switching control of the transistor Tr4 is made by depending on the photocurrent, in detecting light, a maximum electric potential difference between two terminals is determined in accordance with a threshold voltage of the transistor Tr4. Thus, setting the threshold voltage to be as low as 0.5 V or below allows an electric potential difference between terminals to be in a wide range obtained by subtracting a threshold voltage (0.5 V or below) from a power source voltage Vcc (a fixed potential).

(3) Zero Biasing of Photodiode

The zero bias circuit 22 causes a bias voltage of the photodiode PD to be zero. This eliminates the need for the photodiode PD charging its own capacitance even when the photocurrent Ipd flows in. This is desirable because a signal response speed of the light receiving sensor 10 can be increased.

Embodiment 5

The following description discusses Embodiment 5 of the present invention with reference to FIG. 6.

Note that in Embodiment 5, identical reference signs are given to components having the same functions as components in Embodiment 4, and descriptions of the components are omitted.

[Configuration of Light Receiving Sensor]

FIG. 6 is a circuit diagram illustrating a configuration of a light receiving sensor 11 of the present embodiment.

As illustrated in FIG. 6, the light receiving sensor 11 (the optical sensor) includes a light receiving element 16 and an external resistor RL.

As in the light receiving element 15 of Embodiment 4 described earlier, the light receiving element 16 includes two terminals T1 and T2, the resistor R11, and the zero bias circuit 22. Further, the light receiving element 16 includes a detection signal generation unit 24 instead of the detection signal generation unit 21 in the light receiving element 15.

As in the detection signal generation unit 21, the detection signal generation unit 24 includes the photodiode PD, the resistors R1 and R2, the transistors Tr1, Tr2, Tr4, and Tr5 (the MOS transistors), and the first current mirror circuit CM1. Further, the detection signal generation unit 24 includes the transistor Tr6 instead of the transistor Tr3 in the detection signal generation unit 21.

The transistor Tr6 (the auxiliary MOS transistor) is the NchMOS transistor. A drain of the transistor Tr6 is connected with a terminal T1 and with a gate of the transistor Tr6. Such diode connection causes the transistor Tr6 to serve as a diode. Further, a source of the transistor Tr6 is connected with a source of the transistor Tr2.

[Effect Obtained by Light Receiving Section]

As in the light receiving sensor 10 of Embodiment 4, the light receiving sensor 11 is also configured such that a source of the transistor Tr11 in the light receiving sensor 1 of Embodiment 1 is connected with a gate of the transistor Tr4 (the NchMOS transistor) via the resistors R31 and R2.

The light receiving sensor 11 having such a configuration can decrease a threshold voltage in the same manner as in the transistor Tr11 of Embodiment 3, by connecting a back gate of the transistor Tr2 with a gate of the transistor Tr2. Accordingly, the transistor Tr2 can be driven with a low voltage. As a result, the light receiving sensor 11 can operate at a high speed so that a response property of the light receiving sensor can be improved.

Further, the detection signal generation unit 24 includes the transistor Tr6 which is a diode-connected NchMOS transistor. In other words, the light receiving sensor 11 includes the transistor Tr6 instead of the transistor Tr3 in the light receiving sensor 10. Accordingly, a decrease in threshold voltage of the NchMOS transistor in the light receiving element 16 leads to a similar decrease in threshold voltage of the transistor Tr6. Therefore, a response characteristic of the light receiving sensor 11 can be improved as compared to a response characteristic of the light receiving sensor 10. Reasons thereof are described below.

(a) of FIG. 7 illustrates the result of a simulation of a response property with respect to the NchMOS transistor when the detection signal of the light receiving sensor 10 changes from a high level to a low level. (b) of FIG. 7 illustrates the result of a simulation of a response property with respect to the NchMOS transistor when the detection signal of the light receiving sensor 11 changes from a high level to a low level. (a) and (b) of FIG. 7 illustrate a fall time TPHL in which the detection signal changes from a high level to a low level relative to the threshold voltage (Vth) of the transistor Tr2. As illustrated in (a) of FIG. 7, in the light receiving sensor 10, a fall time TPHL relative to any value of Vth at −25° C. (shown in a circle), 25 C (shown in a triangle), and 85° C. (shown in a square) is distributed in a range of 9 to 18 μS. On the other hand, as illustrated in (b) of FIG. 7, in the light receiving sensor 11, a fall time TPHL relative to any value of Vth under −25° C., 25° C., and 85° C. is distributed in a range of 5.5 to 11 μS. Especially, in a range where Vth is lower than 0.2 V, a fall time TPHL can be shortened in the light receiving sensor 11 ((b) of FIG. 7) than in the light receiving sensor 10 ((a) of FIG. 7).

In this manner, the light receiving sensor 11 includes the transistor Tr6 to reduce a dependency on the NchMOS transistor so that a response delay can be prevented. Accordingly, a response property of the light receiving sensor can be beneficially improved.

Embodiment 6

Each light receiving sensors 1, 2, 10, and 11 of Embodiments 1 through 5 described earlier is suitably used for an electronic device such as a digital camera, a copying machine, a printer, and a portable device, each using a photo interrupter. Further, the light receiving sensors 1, 2, 10, and 11 are suitably used for, for example, a smoke sensor, a proximity sensor, and a distance measuring sensor which cannot secure a sufficient volume. Each of the smoke sensor, the proximity sensor, and the distance measuring sensor can be realized by a detector using a light-emitting element and a light-receiving element. The smoke sensor senses a sensitivity fluctuation depending on a quantity of a smoke which blocks a space between the light-emitting element and the light-receiving element. Both the proximity sensor and the distance measuring sensor causes the light-receiving element to sense a quantity of light reflected by an object to be detected in response to light emitted from the light-emitting element. Thus, using the light receiving sensors 1, 2, 10, and 11 as described earlier for any of the sensors, the sensor can be beneficially driven with fewer terminals and with a low voltage.

Further, as described earlier, the light receiving sensors 1, 2, 10, and 11 allow an operation at a high speed and also allow securing a sufficient magnitude of an SN ratio of a detection signal relative to a small photocurrent Ipd. The application of the light receiving sensors 1, 2, 10, and 11 is beneficial because an object can be detected precisely at a high speed by applying the light receiving sensors 1, 2, 10, and 11 to any of the sensors.

[Configuration of Copying Machine]

Here, the following explains a copying machine as a specific example of an electronic device that employs an optical sensor. FIG. 8 is a front view illustrating an internal configuration of the copying machine 301.

As shown in FIG. 8, in a copying machine 301, a document placed on a platen 303 provided in an upper section of a main body 302 is irradiated with light of a light source lamp 304. Then, light reflected from the document is thrown onto a charged photosensitive drum 307 via a group of mirrors 305 and a lens 306 and thereby an exposure process is carried out. Further, the copying machine 301 adheres toner onto a static latent image that is formed on the photosensitive drum 307 by the exposure process. As a result, a toner image is formed. Further, the copying machine 301 transfers the toner image on the photosensitive drum 307 onto a sheet supplied via a sheet carrying system 311 from a manual sheet feeding tray 308 or a sheet feeding cassette 309 or 310. Subsequently, the toner image is fixed in a fixing device 312 and then the sheet is discharged to the outside of the main body 302.

In the copying machine 301 configured as described above, for detecting a position of each section or detecting passage of a sheet, optical sensors S1 to S12 are provided.

The optical sensors S1 to S4 are provided for detecting a position of a part of the group of mirrors 305 that move in a light scanning direction of the document. The optical sensors S5 and S6 are provided for detecting a position of a lens 306 that moves together with the part of the group of mirrors 305. The optical sensor S7 is provided for detecting a rotational position of the photosensitive drum 307.

The optical sensor S8 is provided for detecting the presence or absence of a sheet on the manual sheet feeding tray 308. The optical sensor S9 is provided for detecting the presence or absence of a sheet that has been fed from the upper sheet feeding cassette 309 and that is being carried. The optical sensor S10 is provided for detecting the presence or absence of a sheet that has been fed from the lower sheet feeding cassette 310 and that is being carried.

The optical sensor S11 is provided for detecting separation of a sheet from the photosensitive drum 307. Further, the optical sensor S12 is provided for detecting discharge of a sheet to the outside of the copying machine 301.

As described above, the copying machine 301 includes many optical sensors S1 to S12. By using light receiving sensors 1, 2, 10, and 11 of any of Embodiments described above as these optical sensors S1 to S12, a function of the copying machine 301 can be enhanced by the optical sensors S1 to S12.

Note that, for convenience of explanation, the optical sensors S1 to S12 are explained as examples above. However, in an actual copying machine, a larger number of optical sensors are often used. Therefore, in such an electronic device, the above-described effects become more prominent.

CONCLUSION

Each optical sensor (the light receiving sensors 1, 2, 10, and 11) according to one aspect of the present invention comprises the photodiode (the photodiode PD) which generates the photocurrent (the photocurrent Ipd) upon receipt of light, the first MOS transistor (the transistors Tr11 and Tr111) through which the photocurrents flows, the second MOS transistor (the transistors Tr12 and Tr112) which forms, together with the first MOS transistor, the current mirror circuit (the first current mirror circuit CM1), the third MOS transistor (the transistors Tr9 and Tr10) whose channel type is different from that of the first MOS transistor, and the current-voltage conversion element (the resistor R10) which converts, to a voltage, a current flowing through the second MOS transistor, the current mirror circuit amplifying the photocurrent, the first MOS transistor having a source connected with a gate of the third MOS transistor, and the third MOS transistor having a threshold voltage that is set to be equal to or above a threshold voltage of the first MOS transistor.

Note that the current-voltage conversion element is typically a resistor, but is not limited to the resistor. Alternatively, the current-voltage conversion element may be an element such as a diode.

The optical sensor is configured such that if the first MOS transistor is a P-type MOS transistor (the transistor Tr11), both a drain and a gate of the first MOS transistor are connected with a cathode of the photodiode. Further, the optical sensor is configured such that if the first MOS transistor is an N-type MOS transistor (the transistor Tr111), both a drain and a gate of the first MOS transistor are connected with an anode of the photodiode.

In the above configuration, the photodiode, upon receipt of light, generates a photocurrent. Accordingly, the photocurrent is amplified by the first MOS transistor and the second MOS transistor both of which form the current mirror circuit. Then, the amplified photocurrent flowing through the second MOS transistor is converted into a voltage by a resistor, and the voltage is outputted as a detection signal.

Further, a threshold voltage of the third MOS transistor is set to be equal to or above a threshold voltage of the first MOS transistor. Accordingly, a reverse bias voltage is applied to the photodiode.

Accordingly, the photodiode operates in a nearly reverse bias state. This decreases a capacitance value of the photodiode and thus increases a response speed of the photodiode. Therefore, the optical sensor can operate at a high speed.

Further, the current flowing through the resistor is larger than the photocurrent as described earlier. Thus, a sufficient magnitude of the current can be secured even if the photocurrent is small. Accordingly, it is possible to secure a sufficient magnitude of an SN of the detection signal with respect to the small photocurrent.

It is preferable that the optical sensor is configured such that a back gate of the first MOS transistor is connected with a gate of the first MOS transistor.

In the above configuration, the back gate and the gate of the first MOS transistor are connected with each other. This allows a decrease in threshold voltage of the first MOS transistor without changing a diffusive concentration. This results in decrease of a leakage current and therefore enables a higher reverse bias voltage to be applied to the photodiode. Consequently, it is possible to improve a response speed of the optical sensor.

The optical sensor comprises an inverter (the transistors Tr1 and Tr2) which turns on or off the third MOS transistor (the transistor Tr4) by switching on or off in accordance with a voltage into which the photocurrent amplified by the current mirror circuit is converted, the inverter being formed by two inverter MOS transistors, one of which (the transistor Tr2) has a channel type that is identical to that of the first MOS transistor and has a back gate and a gate connected with each other.

In the above configuration, on-off switching of the third MOS transistor is controlled by on-off switching of the inverter. Accordingly, it is possible to increase a speed of an operation of the third MOS transistor by increasing a speed of an operation of one of two transistors forming the inverter, especially an inverter MOS transistor whose channel type is identical to that of the first MOS transistor.

A connection between a back gate and a gate of the inverter MOS transistor decreases a threshold voltage of the inverter MOS transistor, so that the inverter MOS transistor can be driven with a low voltage. Accordingly, it is possible to improve a responsivity of the optical sensor.

The optical sensor is preferably such that the inverter MOS transistors are the P-type MOS transistors, and the optical sensor further includes a diode-connected N-type MOS transistor which is an auxiliary MOS transistor (the transistor Tr6) connected in series with the inverter MOS transistor.

In the above configuration, a decrease in threshold voltage of the N-type MOS transistor in the optical sensor leads to a similar decrease in threshold voltage of the auxiliary MOS transistor. Therefore, it is possible to improve a response characteristic of the optical sensor.

An electronic device (the copying machine 301) of one aspect of the present invention includes any of the above optical sensors. Accordingly, a use of an optical sensor allows a precise detection of an object at a high speed.

[Rider]

Further, the present invention is not limited to the description of the embodiments above, but may be altered within the scope of the claims. An embodiment based on a combination of technical means properly altered within the scope of the claims is encompassed in the technical scope of the present invention.

INDUSTRIAL APPLICABILITY

The optical sensor of the present invention is configured as a photo interrupter so as to have a function of detecting, for example, an object and an operating speed of an object. Thus, the optical sensor can be applicable suitably to an electric appliance such as a digital camera, a copying machine, a printer, and a portable device. Further, the optical sensor of the present invention is also applicable suitably to a sensor, such as a smoke sensor, a proximity sensor, and a distance measuring sensor, which cannot secure a sufficient volume.

REFERENCE SIGNS LIST

1 Light receiving sensor (optical sensor)
2 Light receiving sensor (optical sensor)
10 Light receiving sensor (optical sensor)
11 Light receiving sensor (optical sensor)
101 PchMOS transistor
102 NchMOS transistor
113 Gate electrode
114 Back gate electrode
115 Back gate electrode
301 Copying machine (electronic device)
CM1 First current mirror circuit (current mirror circuit)
CM11 First current mirror circuit (current mirror circuit)
PD Photodiode (photoelectric conversion element)
R10 Resistor (current-voltage conversion element)
Tr2 Transistor (inverter MOS transistor)
Tr4 Transistor (third MOS transistor)
Tr6 Transistor (auxiliary MOS transistor)
Tr9 Transistor (third MOS transistor)
Tr10 Transistor (third MOS transistor)
Tr111 Transistor (first MOS transistor)
Tr12 Transistor (second MOS transistor)
Tr111 Transistor (first MOS transistor)
Tr112 Transistor (second MOS transistor)

The invention claimed is:

1. An optical sensor comprising:
a photodiode which generates a photocurrent upon receipt of light;
a first MOS transistor through which the photocurrent flows;
a second MOS transistor which forms, together with the first MOS transistor, a current mirror circuit;
a third MOS transistor whose channel type is different from that of the first MOS transistor; and
a current-voltage conversion element which converts, to a voltage, a current flowing through the second MOS transistor,
the current mirror circuit amplifying the photocurrent,
the first MOS transistor having a source connected with a gate of the third MOS transistor, and
the third MOS transistor having a threshold voltage that is set to be equal to or above a threshold voltage of the first MOS transistor.

2. The optical sensor according to claim 1, wherein a back gate of the first MOS transistor is connected with a gate of the first MOS transistor.

3. The optical sensor according to claim 1, further comprising:
- an inverter which turns on or off the third MOS transistor by switching on or off in accordance with a voltage into which the photocurrent amplified by the current mirror circuit is converted,
- wherein the inverter is formed by two inverter MOS transistors, one of which has a channel type that is identical to that of the first MOS transistor and has a back gate and a gate connected with each other.

4. The optical sensor according to claim 3, wherein
the inverter MOS transistors are P-type MOS transistors, and
the optical sensor further includes a diode-connected N-type MOS transistor which is an auxiliary MOS transistor connected in series with the inverter MOS transistor.

5. The optical sensor according to claim 1, wherein
the first MOS transistor is a P-type MOS transistor, and both a drain and a gate of the first MOS transistor are connected with a cathode of the photodiode.

6. The optical sensor according to claim 1, wherein
the first MOS transistor is an N-type MOS transistor, and both a drain and a gate of the first MOS transistor are connected with an anode of the photodiode.

7. An electronic device comprising an optical sensor of claim 1.

* * * * *